US012720938B2

(12) United States Patent
Tai

(10) Patent No.: US 12,720,938 B2
(45) Date of Patent: Aug. 25, 2026

(54) LIGHT-EMITTING DIODE PACKAGE STRUCTURE AND MANUFACTURING METHOD THEREOF

(71) Applicant: E Ink Holdings Inc., Hsinchu (TW)

(72) Inventor: Sheng-Chieh Tai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 407 days.

(21) Appl. No.: 18/355,375

(22) Filed: Jul. 19, 2023

(65) Prior Publication Data

US 2024/0170617 A1 May 23, 2024

(30) Foreign Application Priority Data

Nov. 17, 2022 (TW) ................................. 111143930

(51) Int. Cl.
*H10H 29/01* (2025.01)
*H10H 29/20* (2026.01)
(Continued)

(52) U.S. Cl.
CPC ...... *H10H 29/036* (2025.01); *H10H 29/0361* (2025.01); *H10H 29/0363* (2025.01); *H10H 29/20* (2025.01); *H10H 29/24* (2025.01); *H10H 29/85* (2025.01); *H10H 29/851* (2025.01); *H10H 29/856* (2025.01);
(Continued)

(58) Field of Classification Search
CPC .. H10H 20/856; H10H 20/841; H10H 20/851; H10H 20/8511; H10H 20/8512; H10H 20/0361; H10H 29/0361; H10H 29/24; H10H 29/856; H10H 29/851; H10H 29/36; H10H 29/20; H10H 29/0363; F21V 7/005; G02F 1/133615
See application file for complete search history.

(56) References Cited

U.S. PATENT DOCUMENTS 8,760,049 B2 6/2014 Cha et al.
9,239,489 B2 1/2016 Doyle et al.
(Continued)

FOREIGN PATENT DOCUMENTS

| | | | |
|---|---|---|---|
| TW | 200721542 | 6/2007 | |
| TW | 201123548 | 7/2011 | |
| WO | WO-2020036320 A1 * | 2/2020 | ......... H01L 25/0753 |

OTHER PUBLICATIONS

"Office Action of Taiwan Counterpart Application", issued on Aug. 23, 2023, p. 1-p. 6.

*Primary Examiner* — Ratisha Mehta
*Assistant Examiner* — Adam Joseph Mott
(74) *Attorney, Agent, or Firm* — JCIPRNET

(57) ABSTRACT

A light-emitting diode package structure includes a driving substrate, at least one light-emitting unit, and a reflective colloid. The driving substrate has a surface. The light-emitting unit includes at least one mini light-emitting diode and at least one wavelength conversion layer. The mini light-emitting diode is disposed on the surface of the driving substrate and electrically connected to the driving substrate. The wavelength conversion layer covers the mini light-emitting diode. The reflective colloid covers a periphery of the light-emitting unit and the driving substrate. The light-emitting unit is suitable for emitting a light, and the reflective colloid is suitable for reflecting the light so as to focus on a light-emitting direction.

3 Claims, 14 Drawing Sheets

(51) Int. Cl.

| | |
|---|---|
| ***H10H 29/24*** | (2026.01) |
| ***H10H 29/85*** | (2025.01) |
| ***H10H 29/851*** | (2025.01) |
| ***H10H 29/856*** | (2025.01) |
| ***H10P 58/00*** | (2026.01) |
| ***H10W 90/10*** | (2026.01) |
| *F21K 9/00* | (2016.01) |
| *F21K 9/90* | (2016.01) |
| *F21V 7/00* | (2006.01) |
| *F21V 7/24* | (2018.01) |
| *F21Y 103/10* | (2016.01) |
| *F21Y 103/20* | (2016.01) |
| *F21Y 115/10* | (2016.01) |
| *G02F 1/13357* | (2006.01) |

(52) U.S. Cl.

CPC ............. *H10P 58/00* (2026.01); *H10W 90/10* (2026.01); *F21K 9/00* (2013.01); *F21K 9/90* (2013.01); *F21V 7/005* (2013.01); *F21V 7/24* (2018.02); *F21Y 2103/10* (2016.08); *F21Y 2103/20* (2016.08); *F21Y 2115/10* (2016.08); *G02F 1/133615* (2013.01); *H10H 29/8512* (2025.01); *H10H 29/8514* (2025.01)

(56) References Cited

U.S. PATENT DOCUMENTS

| | | | | |
|---|---|---|---|---|
| 11,386,692 | B2 | 7/2022 | Li et al. | |
| 2009/0004778 | A1* | 1/2009 | Lee | B29C 45/27 257/E33.059 |
| 2010/0163898 | A1* | 7/2010 | Hung | H10H 20/8515 257/E33.056 |
| 2011/0156071 | A1* | 6/2011 | Cheng | H10H 20/8513 257/E33.056 |
| 2011/0284822 | A1* | 11/2011 | Jung | H10H 20/8514 257/E33.012 |
| 2015/0221835 | A1* | 8/2015 | Tischler | H10H 20/01 438/27 |
| 2018/0047712 | A1* | 2/2018 | Bang | H10W 90/00 |
| 2018/0182917 | A1* | 6/2018 | Kuramoto | H10H 20/8516 |
| 2018/0204982 | A1* | 7/2018 | Park | H10H 20/8514 |
| 2020/0127171 | A1* | 4/2020 | Tong | H10H 20/8515 |
| 2020/0212264 | A1* | 7/2020 | Kim | H10H 20/8506 |
| 2021/0210470 | A1* | 7/2021 | Huang | H10W 90/00 |
| 2022/0163849 | A1 | 5/2022 | Tien et al. | |
| 2022/0199869 | A1* | 6/2022 | Jia | H10H 20/8513 |

* cited by examiner

U1
130a
120
110a
110a
110a
130a
120
U1
130a
120
U1

LIGHT-EMITTING DIODE PACKAGE STRUCTURE AND MANUFACTURING METHOD THEREOF

CROSS-REFERENCE TO RELATED APPLICATION

This application claims the priority benefit of Taiwan application serial no. 111143930, filed on Nov. 17, 2022. The entirety of the above-mentioned patent application is hereby incorporated by reference herein and made a part of this specification.

BACKGROUND

Technical Field

The disclosure relates to a light-emitting structure and a manufacturing method thereof, and particularly relates to a light-emitting diode package structure and a manufacturing method thereof.

Description of Related Art

Existing mini or micro light-emitting diode packages are mainly designed to emit light from five sides (the front side and the four sides around). Since the size of a mini light-emitting diode chip is only about 0.1 mm to 0.2 mm, usually the mini light-emitting diode chip is individually packaged and then placed in a cup shell of a lead frame, and a fluorescent-powder adhesive is added to be cured. If a 0.15 mm mini light-emitting diode package is to be manufactured, the above-mentioned mini light-emitting diode chip after being individually packaged cannot be put into the cup shell of the lead frame. In addition, if the above-mentioned five-sided light-emitting mini light-emitting diode package is applied to a side-lit display, only the light emitted from the front side can easily enter a light guide plate, and the light from the other four sides around cannot be effectively coupled into the light guide plate, resulting in poor light coupling efficiency.

SUMMARY

The disclosure provides a light-emitting diode package structure, which can increase an amount of light emission in a forward direction.

The disclosure also provides a manufacturing method of the light-emitting diode package structure, which is used to manufacture the above-mentioned light-emitting diode package structure.

The light-emitting diode package structure of the disclosure includes a driving substrate, at least one light-emitting unit, and a reflective colloid. The driving substrate has a surface. The light-emitting unit includes at least one mini light-emitting diode and at least one wavelength conversion layer. The mini light-emitting diodes are disposed on the surface of the driving substrate and electrically connected to the driving substrate. The wavelength conversion layer covers the mini light-emitting diodes. The reflective colloid covers a periphery of the light-emitting unit and the driving substrate. The light-emitting unit is suitable for emitting a light, and the reflective colloid is suitable for reflecting the light so as to focus on a light-emitting direction.

In an embodiment of the disclosure, the above-mentioned at least one light-emitting unit is a light-emitting unit. The at least one mini light-emitting diode includes multiple mini light-emitting diodes. The at least one wavelength conversion layer is a wavelength conversion layer. The mini light-emitting diodes are separated from each other and disposed on the driving substrate. The wavelength conversion layer covers the mini light-emitting diodes to define a light-emitting unit.

In an embodiment of the disclosure, the above-mentioned at least one light-emitting unit includes multiple light-emitting units. The at least one mini light-emitting diode includes multiple mini light-emitting diodes. The at least one wavelength conversion layer includes multiple wavelength conversion layers. The mini light-emitting diodes are separated from each other and disposed on the driving substrate. The wavelength conversion layers are separated from each other and respectively cover the mini light-emitting diodes to define light-emitting units.

In an embodiment of the disclosure, a shape of the wavelength conversion layer includes an inverted trapezoid or a rectangle as viewed from a cross-section.

In an embodiment of the disclosure, the above-mentioned light-emitting unit further includes a transparent colloid covering the mini light-emitting diodes and positioned between the mini light-emitting diodes and the wavelength conversion layer. As viewed from the cross-section, the shape of the wavelength conversion layer is a rectangle, while a shape of the transparent colloid is an inverted trapezoid.

The manufacturing method of the light-emitting diode package structure of the disclosure includes the following steps. A driving substrate and at least one mini light-emitting diode are provided. The mini light-emitting diode is joined on the driving substrate. The driving substrate has a surface, and the mini light-emitting diode is disposed on a surface of the driving substrate and electrically connected to the driving substrate. At least one wavelength conversion layer is formed to cover the mini light-emitting diode to define at least one light-emitting unit. A reflective colloid is formed to cover a periphery of the light-emitting unit and the driving substrate. The light-emitting unit is suitable for emitting a light, and the reflective colloid is suitable for reflecting the light so as to focus on a light-emitting direction.

In an embodiment of the disclosure, the above-mentioned at least one light-emitting unit is a light-emitting unit. The at least one mini light-emitting diode includes multiple mini light-emitting diodes. The at least one wavelength conversion layer is a wavelength conversion layer. The mini light-emitting diodes are separated from each other and disposed on the driving substrate. The wavelength conversion layer covers the mini light-emitting diodes and the driving substrate.

In an embodiment of the disclosure, the above-mentioned manufacturing method of the light-emitting diode package structure further includes the following. A singulation process is performed before forming the reflective colloid to cut the wavelength conversion layer and the driving substrate to define the light-emitting unit positioned on the driving substrate.

In an embodiment of the disclosure, the above-mentioned manufacturing method of light-emitting diode package structure further includes the following. A substrate material is provided before providing the driving substrate and the mini light-emitting diodes. The mini light-emitting diodes include multiple mini light-emitting diodes, and the mini light-emitting diodes are separated from each other and disposed on the substrate material. A wavelength conversion material layer is formed on the substrate material to cover the mini light-emitting diodes. The substrate material is removed and a singulation process is performed to cut the wavelength conversion material layer to form a light-emitting unit. The light-emitting unit includes multiple light-emitting units. The wavelength conversion layer includes multiple wavelength conversion layers. The wavelength conversion layers are separated from each other and respectively cover the mini light-emitting diodes to define the light-emitting units. The mini light-emitting diodes are joined on the driving substrate, and the light-emitting units are separated from each other and disposed on the driving substrate.

In an embodiment of the disclosure, the above-mentioned method of forming the reflective colloid includes integrally forming by a mold filling manner.

Based on the above, in the design of the light-emitting diode package structure of the disclosure, the reflective colloid covers the periphery of the light-emitting unit and the driving substrate. The light-emitting unit is suitable for emitting the light, and the reflective colloid is suitable for reflecting the light so as to focus on the light-emitting direction. In this way, the light emitted by the light-emitting unit can be emitted in a more focused manner, and the focused light emission from the front side can be increased. Therefore, the light-emitting diode package structure of the disclosure can increase the amount of light emission in the forward direction to improve the directivity of the light emission.

In order to make the above-mentioned features and advantages of the disclosure more comprehensible, the following embodiments are described in detail together with the accompanying drawings.

DESCRIPTION OF THE EMBODIMENTS

Figure 1:
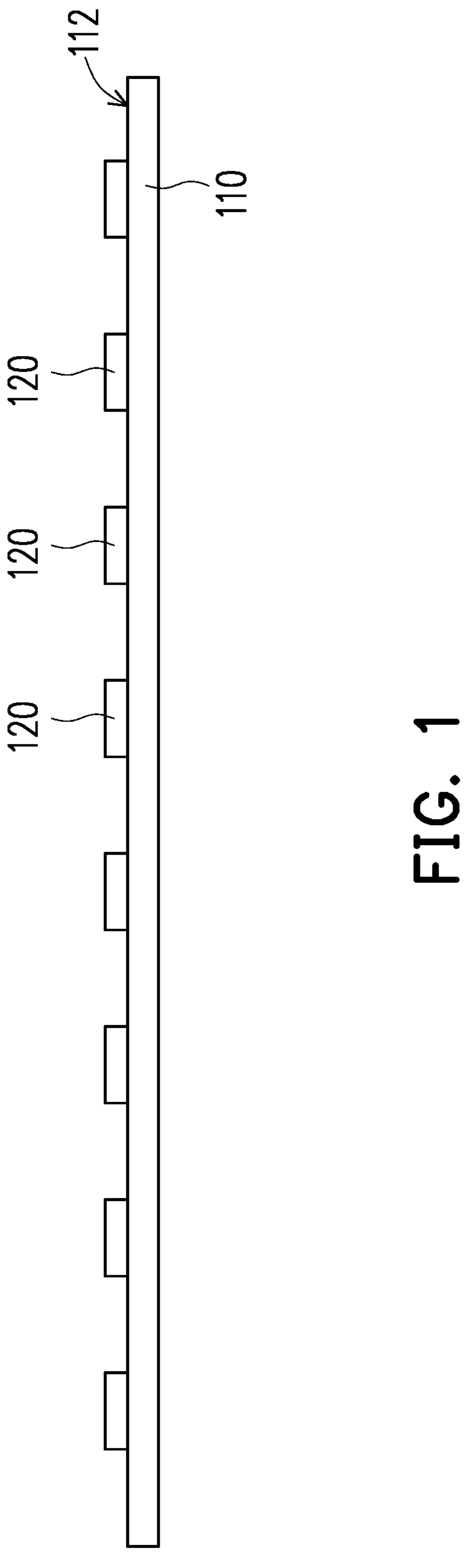
FIG. 1 to FIG. 7 are schematic diagrams of a manufacturing method of a light-emitting diode package structure according to an embodiment of the disclosure.

The disclosure may be understood by referring to the following detailed description in conjunction with the accompanying drawings. It should be noted that, for the sake of easy understanding for readers and the simplicity of the drawings, the elements in the drawings are not drawn according to actual scale. In addition, the quantity and size of each element in the FIG. are only for illustration, and are not intended to limit the scope of the disclosure.

Figure 2:
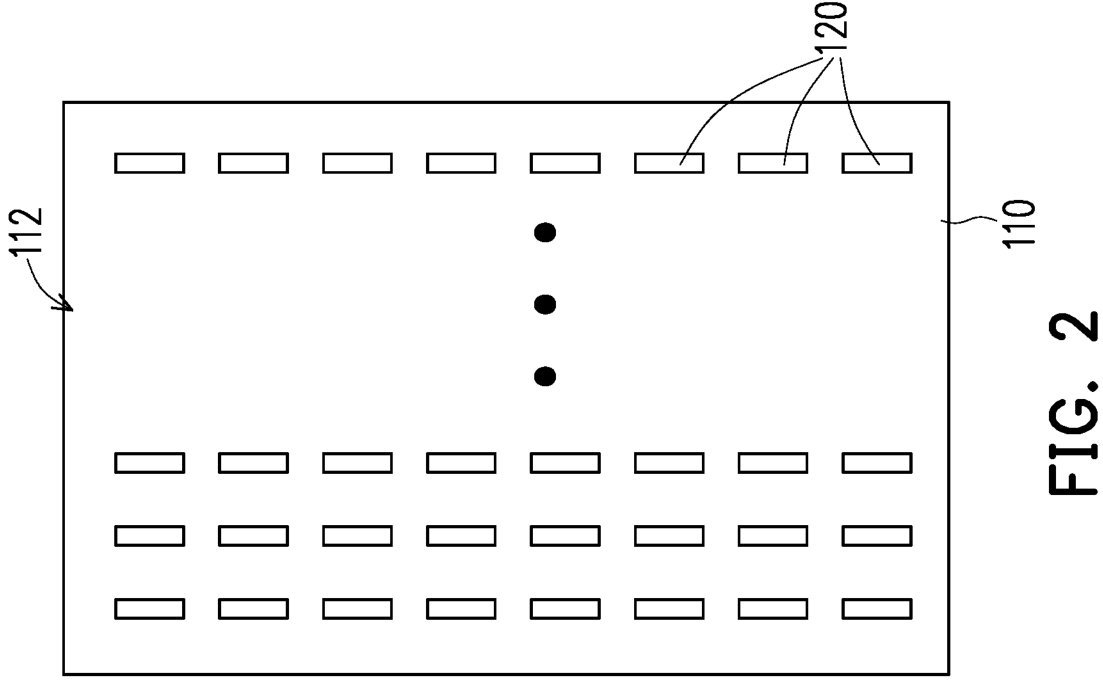
Figure 3:
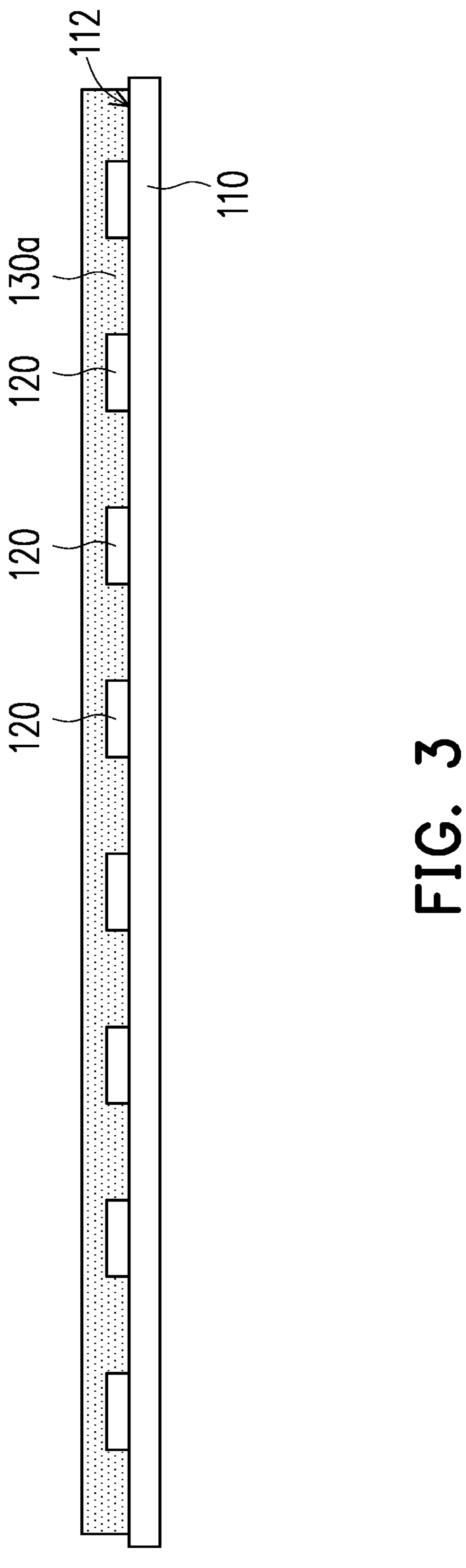
Figure 4:
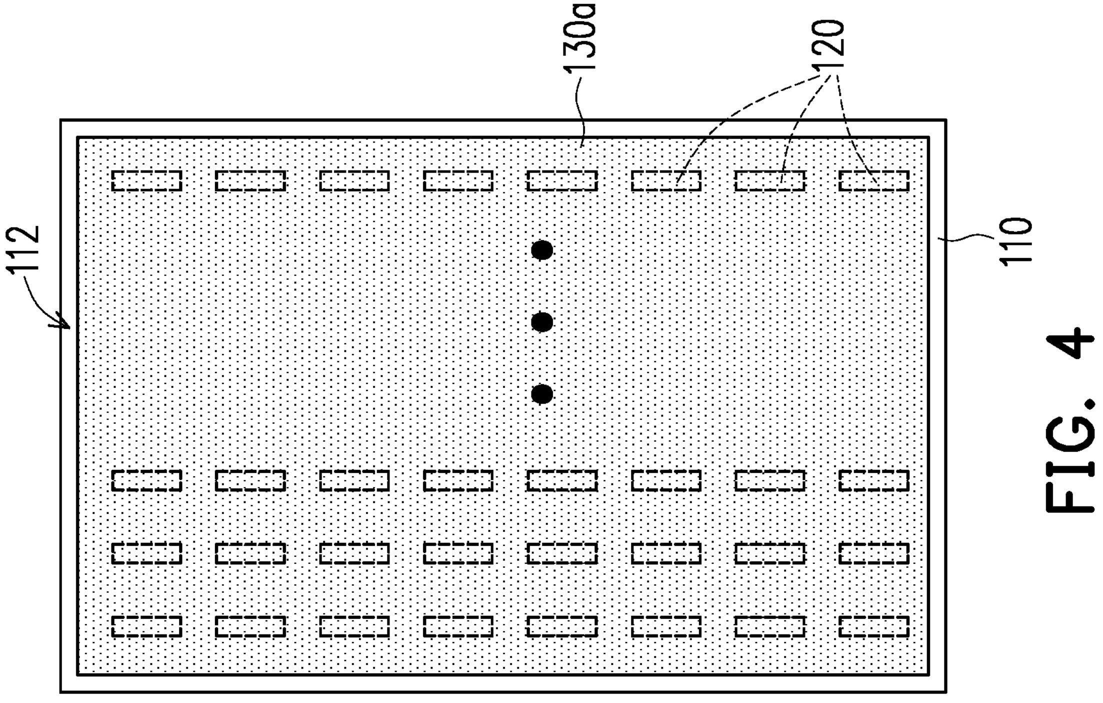
Figure 5:
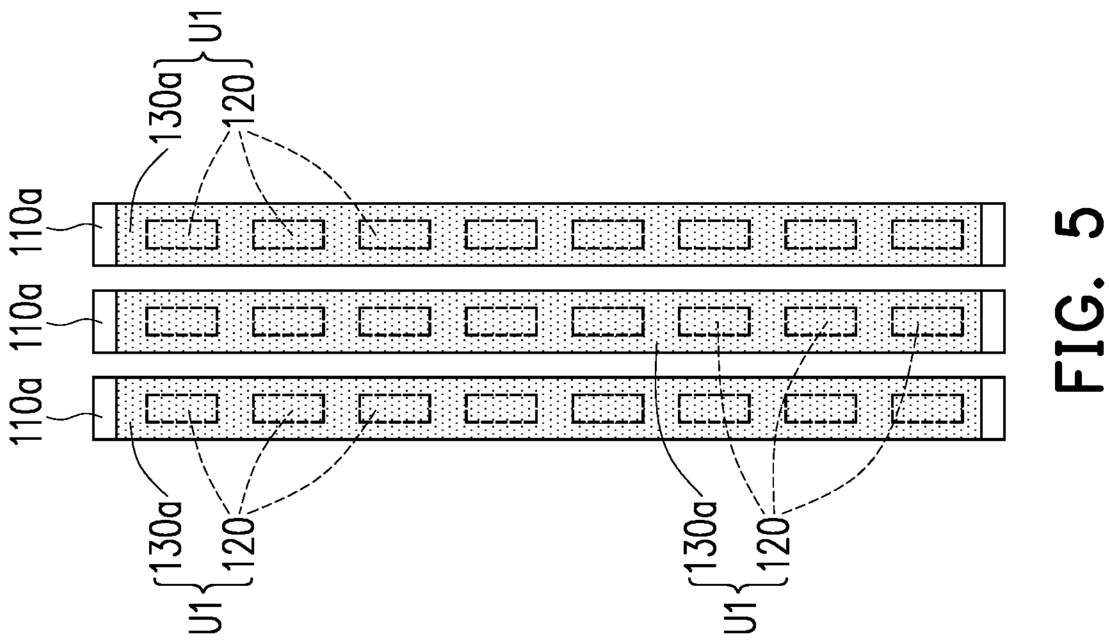
Figure 6:
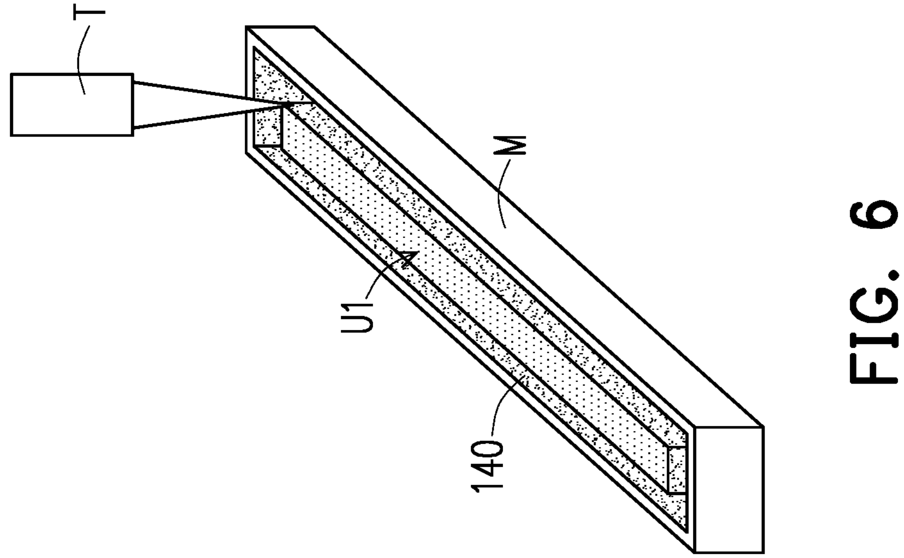
Figure 7:
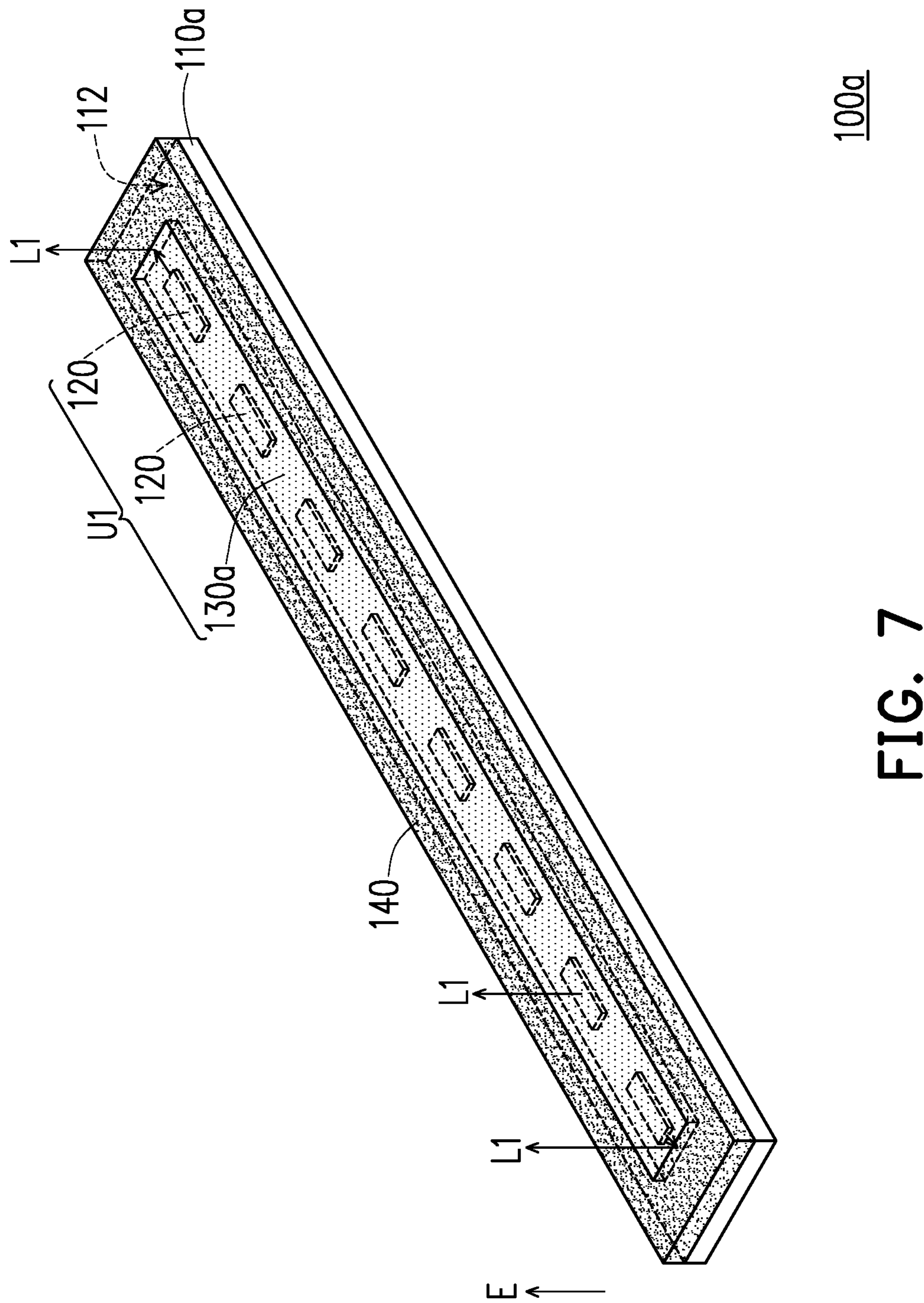

FIG. 1 to FIG. 7 are schematic diagrams of a manufacturing method of a light-emitting diode package structure according to an embodiment of the disclosure. It should be noted that, for the convenience of explanation, FIG. 1 and FIG. 3 are illustrated from a cross-section; FIG. 2 and FIG. 4 are top view diagrams of FIG. 1 and FIG. 3 respectively; FIG. 5 is a top view diagram after cutting FIG. 4; and FIG. 6 and FIG. 7 are illustrated in stereograms.

Please refer to FIG. 1 and FIG. 2 at the same time first. Regarding the manufacturing method of the light-emitting diode package structure of this embodiment, firstly, a driving substrate 110 and at least one mini light-emitting diode (multiple mini light-emitting diodes 120 are schematically illustrated) are provided. Here, the driving substrate 110 is, for example, a flexible circuit board or a printed circuit board, but is not limited thereto. The mini light-emitting diodes 120 are, for example, multiple blue light-emitting diode chips, multiple red light-emitting diode chips, multiple green light-emitting diode chips or a combination thereof.

Next, please refer to FIG. 1 and FIG. 2 at the same time again. The mini light-emitting diodes 120 are joined on the driving substrate 110, and the driving substrate 110 has a surface 112. The mini light-emitting diodes 120 are disposed on the surface 112 of the driving substrate 110 and electrically connected to the driving substrate 110. Here, the mini light-emitting diodes 120 are separated from each other and arranged in a matrix on the driving substrate 110 in a flip-chip bonding manner.

Next, please refer to FIG. 3 and FIG. 4 at the same time. At least one wavelength conversion layer (a wavelength conversion layer 130*a* is schematically illustrated) is formed on the surface 112 of the driving substrate 110 to cover the mini light-emitting diodes 120 and the driving substrate 110. The wavelength conversion layer 130*a* is a fluorescent-powder-mixed adhesive, which can be, for example, a yellow fluorescent-powder adhesive layer, a red fluorescent-powder adhesive layer, a green fluorescent-powder adhesive layer, a blue fluorescent-powder adhesive layer, or an yttrium aluminum garnet fluorescent-powder adhesive layer.

Next, referring to FIG. 5, a singulation process is performed to cut the wavelength conversion layer 130*a* and the driving substrate 110 to form multiple light bars with predetermined lengths. Each light bar includes a driving substrate 110*a* and at least one light-emitting unit (a light-emitting unit U1 is schematically illustrated) positioned on the driving substrate 110*a*, and each light-emitting unit U1 includes multiple mini light-emitting diodes 120 and a wavelength conversion layer 130*a* covering the mini light-emitting diodes 120.

Afterward, referring to FIG. 5 and FIG. 6 at the same time, a reflective colloid 140 is formed to cover a periphery of the light-emitting unit U1 and the driving substrate 110*a*. Here, a cut light bar is placed in a mold M first, and a colloid is poured with a tool T and cured to form the reflective colloid 140 covering the periphery of the light-emitting unit U1 and covering the driving substrate 110. That is, a method of forming the reflective colloid 140 is integrally forming a cup shell by mold filling. Here, the reflective colloid 140 is, for example, a colloid doped with reflective particles, or a colloid thereof has high reflective properties. The above-mentioned curing method is, for example, thermal curing, moisture curing, or ultraviolet curing, which can be selected according to characteristics of the colloid. In an embodiment, the colloid can also be selected as a waterproof glue, so that the cured reflective colloid 140 can also have waterproof function.

Finally, please refer to FIG. 6 and FIG. 7 at the same time. The mold M is demolded to form a light-emitting diode package structure 100*a*. Here, the light-emitting diode package structure 100*a* includes the driving substrate 110*a*, the light-emitting unit U1, and the reflective colloid 140. The driving substrate 110*a* has the surface 112. The light-emitting unit U1 includes multiple mini light-emitting diodes 120 and the wavelength conversion layer 130*a*. Here, the wavelength conversion layer 130*a* covers multiple mini light-emitting diodes 120 to define the light-emitting unit U1. The mini light-emitting diodes 120 are separated from each other and disposed on the surface 112 of the driving substrate 110*a* and electrically connected to the driving substrate 110*a*. The wavelength conversion layer 130*a* covers the mini light-emitting diodes 120. The reflective colloid 140 covers the periphery of the light-emitting unit U1 and the driving substrate 110*a*. The light-emitting unit U1 is suitable for emitting a light L1, and the reflective colloid 140 is suitable for reflecting the light L1 so as to focus on a light-emitting direction E. In this way, a problem that the mini light-emitting diode package emits light toward five sides in the prior art can be improved. The light L1 emitted by the light-emitting unit U1 can be emitted in a more focused manner, and like a linear light source, the focused light emission from the front side can be increased. Therefore, the light-emitting diode package structure 100*a* of this embodiment can increase an amount of light emission in a forward direction to improve the directivity of the light emission.

It should be noted here that the following embodiments use the reference numerals and part of the content of the previous embodiments, in which the same numerals are used to denote the same or similar components, and descriptions of the same technical content are omitted. For the description of omitted parts, reference may be made to the foregoing embodiments, and will not be repeated in the following embodiments.

Figure 8:
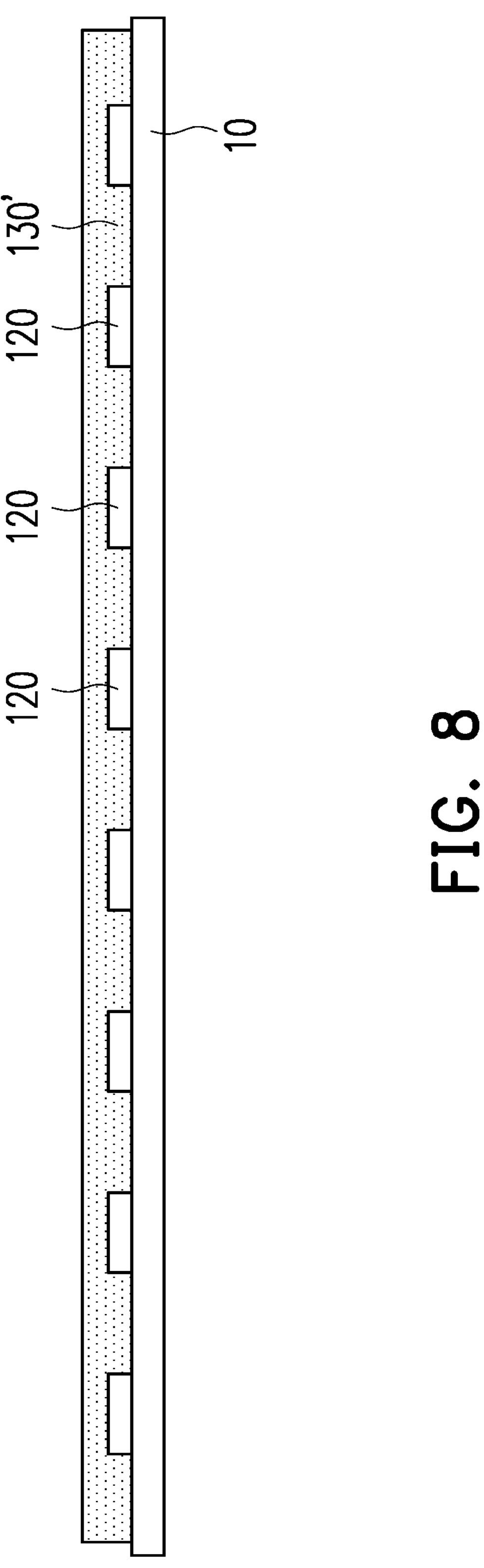
FIG. 8 to FIG. 13 are schematic diagrams of a manufacturing method of a light-emitting diode package structure according to another embodiment of the disclosure.
Figure 9:
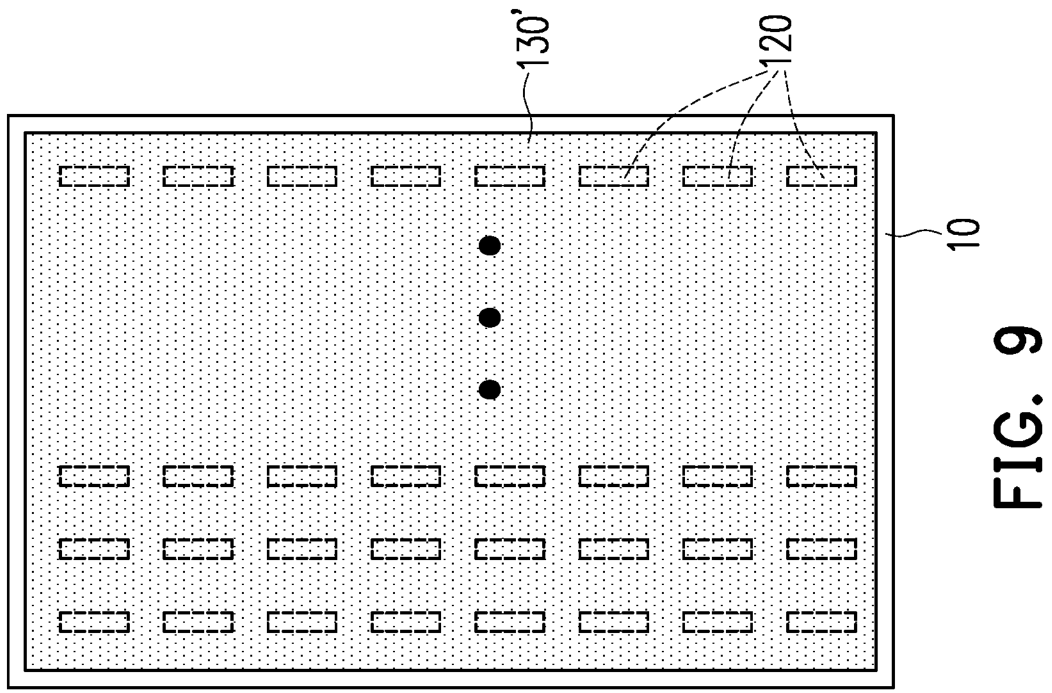
Figure 10:
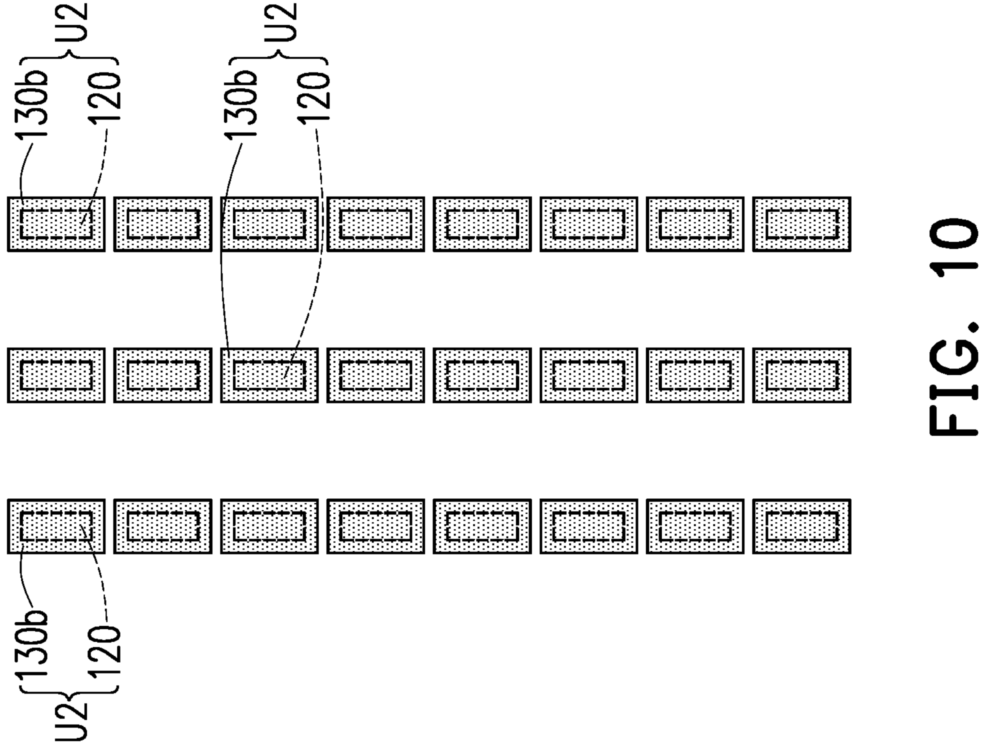
Figure 11:
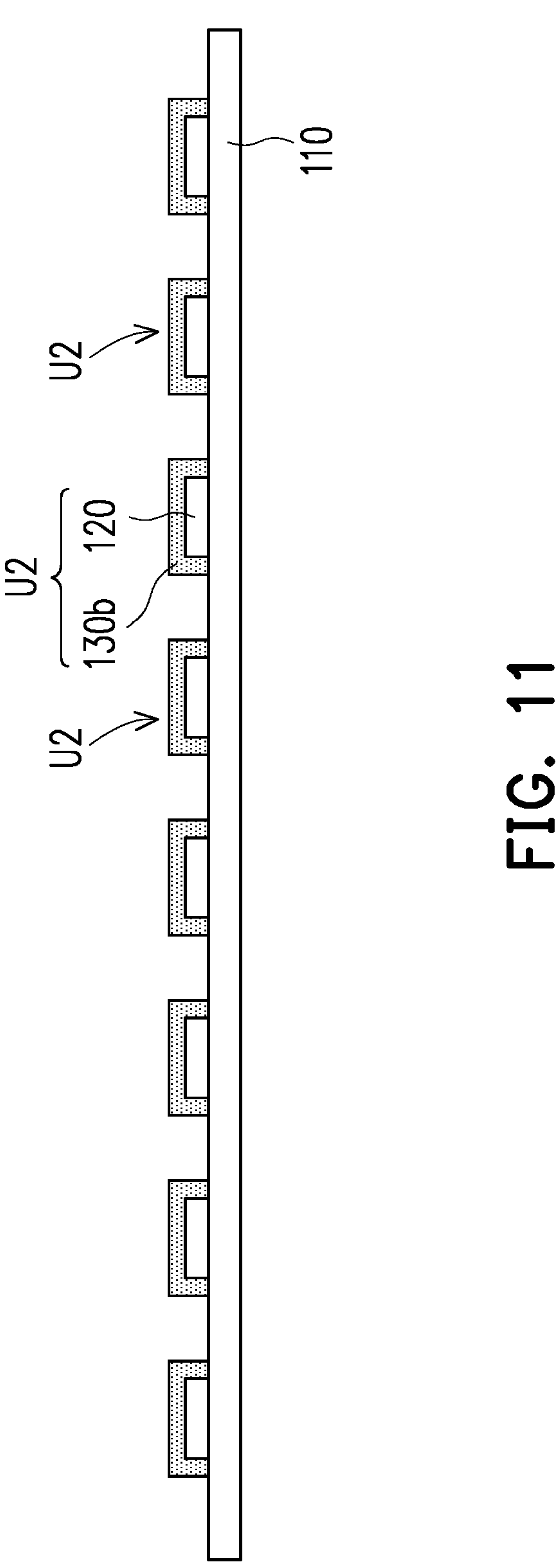
Figure 12:
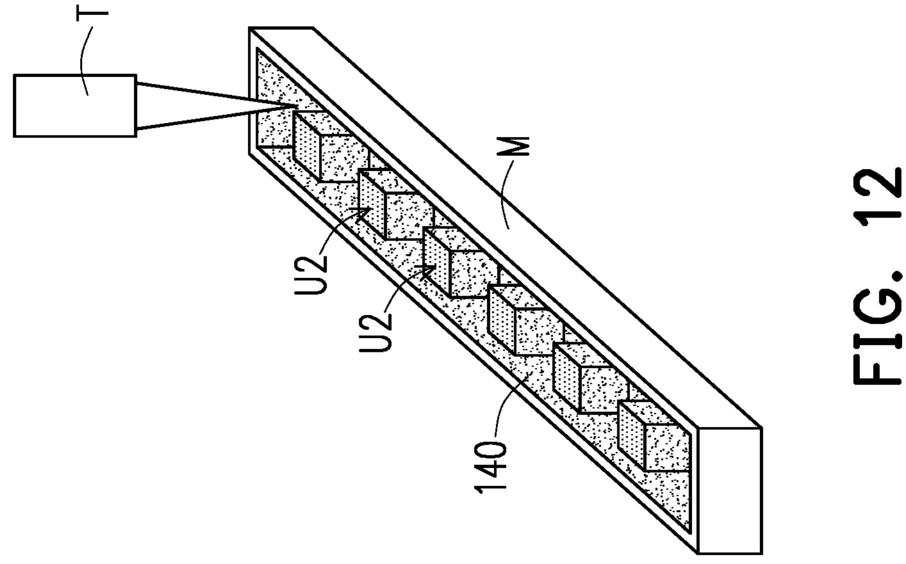
Figure 13:
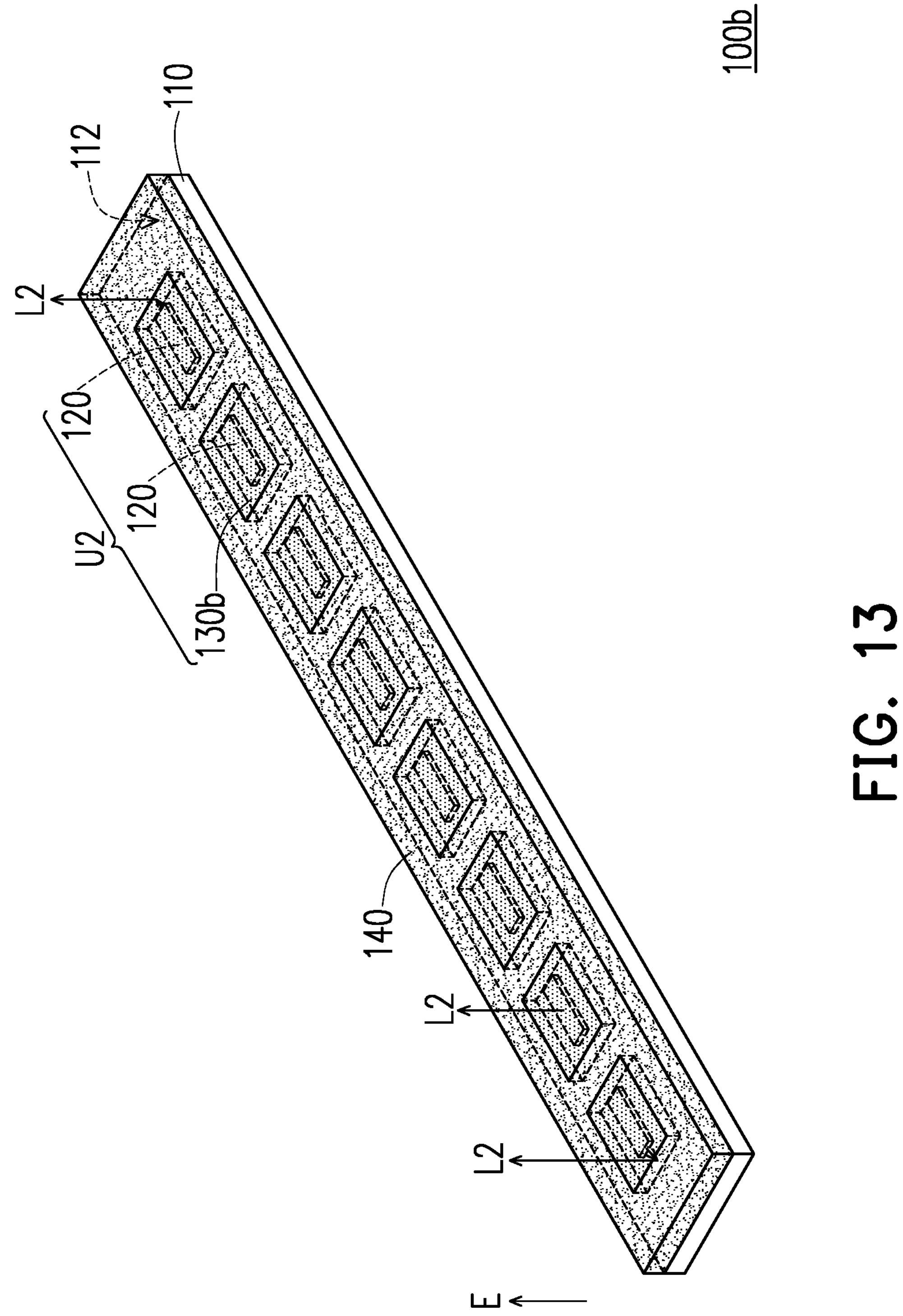

FIG. 8 to FIG. 13 are schematic diagrams of a manufacturing method of a light-emitting diode package structure according to another embodiment of the disclosure. It should be noted that, for the convenience of explanation, FIG. 8 and FIG. 11 are illustrated from the cross-section; FIG. 9 is a top view diagram of FIG. 8; FIG. 10 is a top view diagram after cutting FIG. 9; and FIG. 12 and FIG. 13 are stereograms.

Please refer to FIG. 8 and FIG. 9 at the same time first. Regarding the manufacturing method of the light-emitting diode package structure of this embodiment, firstly, a substrate material 10 is provided, and the substrate material 10 is, for example, a temporary substrate. Next, at least one mini light-emitting diode (multiple mini light-emitting diodes 120 are schematically illustrated) is provided on the substrate material 10, and the mini light-emitting diodes 120 are separated from each other and arranged in a matrix on the substrate material 10. Next, a wavelength conversion material layer 130' is formed on the substrate material 10 to cover the mini light-emitting diodes 120. The wavelength conversion material layer 130' is, for example, a fluorescent-powder-mixed adhesive, which can be, for example, a yellow fluorescent-powder adhesive layer, a red fluorescent-powder adhesive layer, a green fluorescent-powder adhesive layer, a blue fluorescent-powder adhesive layer, or an yttrium aluminum garnet fluorescent-powder adhesive layer.

Next, referring to FIG. 9 and FIG. 10 at the same time, the substrate material 10 is removed and a singulation process is performed to cut the wavelength conversion material layer 130' to form multiple light-emitting units U2. Here, each light-emitting unit U2 includes a mini light-emitting diode 120 and a wavelength conversion layer 130*b* covering the mini light-emitting diode 120. That is, multiple wavelength conversion layers 130*b* are separated from each other and respectively covering the multiple mini light-emitting diodes 120 to define multiple light-emitting units U2.

Next, please refer to FIG. 11. The mini light-emitting diodes 120 are joined on the driving substrate 110, and the light-emitting units U2 are separated from each other and disposed on the driving substrate 110.

Afterward, referring to FIG. 11 and FIG. 12 at the same time, the reflective colloid 140 is formed to cover the periphery of the light-emitting units U2 and the driving substrate 110. Here, the driving substrate 110 and the light-emitting unit U2 joined on the driving substrate 110 are placed in the mold M first, and the colloid is poured with the tool T and cured to form the reflective colloid 140 covering the periphery of the light-emitting units U2 and covering the driving substrate 110. That is, the method of forming the reflective colloid 140 is integrally forming the cup shell by mold filling.

Finally, please refer to FIG. 12 and FIG. 13 at the same time, and the mold M is demolded to form a light-emitting diode package structure 100*b*. Here, the light-emitting diode package structure 100*b* includes the driving substrate 110, multiple light-emitting units U2, and the reflective colloid 140. The driving substrate 110 has the surface 112. The light-emitting units U2 include multiple mini light-emitting diodes 120 and multiple wavelength conversion layers 130*b*. Here, a wavelength conversion layer 130*b* covers a mini light-emitting diode 120 to define a light-emitting unit U2. The mini light-emitting diodes 120 are separated from each other and disposed on the surface 112 of the driving substrate 110 and electrically connected to the driving substrate 110. The wavelength conversion layer 130*b* covers the mini light-emitting diodes 120. The reflective colloid 140 covers the periphery of the light-emitting unit U2 and the driving substrate 110. The light-emitting unit U2 is suitable for emitting a light L2, and the reflective colloid 140 is suitable for reflecting the light L2 so as to focus on the light-emitting direction E. In this way, the light L2 emitted by the light-emitting unit U2 can be emitted in a more focused manner, and the focused light emission from the front side can be increased. Therefore, the light-emitting diode package structure 100*b* of this embodiment can increase the amount of light emission in the forward direction to improve the directivity of the light emission.

Figure 15:
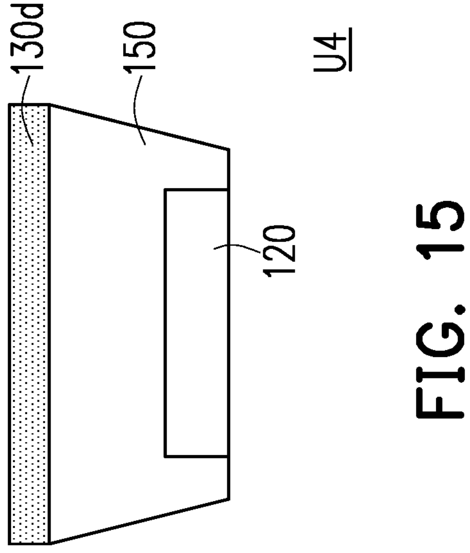
FIG. 14 and FIG. 15 are schematic cross-section diagrams of various light-emitting units in multiple embodiments of the disclosure.
Figure 14:
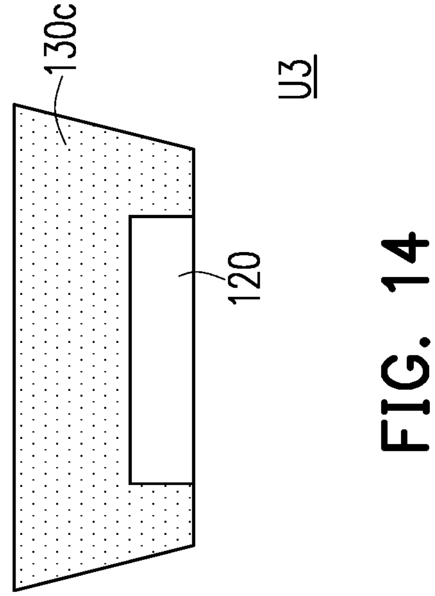

FIG. 14 and FIG. 15 are schematic cross-sectional diagrams of various light-emitting units in multiple embodiments of the disclosure. It is worth mentioning that, in the above-mentioned steps of FIG. 5 and/or FIG. 10, that is, during the singulation process, a single light bar or a single light-emitting unit U3 as shown in FIG. 14 can be cut through a special cutting method. As viewed from the cross-section, a shape of the wavelength conversion layer 130*c* is realized as an inverted trapezoid, which can increase light emission efficiency. In another embodiment, referring to FIG. 15, a light-emitting unit U4 further includes a transparent colloid 150 covering the mini light-emitting diode 120 and positioned between the mini light-emitting diode 120 and a wavelength conversion layer 130*d*. As viewed from the cross-section, a shape of the wavelength conversion layer 130*d* is a rectangle, while a shape of the transparent colloid 150 is an inverted trapezoid, which can increase the light emission efficiency. In an embodiment, the wavelength conversion layer 130*d* may also be a fluorescent-powder adhesive film.

In summary, in the design of the light-emitting diode package structure of the disclosure, the reflective colloid covers the periphery of the light-emitting unit and the driving substrate. The light-emitting unit is suitable for emitting the light, and the reflective colloid is suitable for reflecting the light so as to focus on the light-emitting direction. In this way, the light emitted by the light-emitting unit can be emitted in a more focused manner, and the focused light emission from the front side can be increased. Therefore, the light-emitting diode package structure of the disclosure can increase the amount of light emission in the forward direction to improve the directivity of the light emission. In addition, when subsequently coupled with a light guide plate, a high light emission efficiency can be achieved, which can improve a brightness performance of a display.

Although the disclosure has been disclosed with reference to the embodiments above, they are not intended to limit the disclosure. Persons with ordinary knowledge in the technical field may make some changes and modifications without departing from the spirit and scope of the disclosure. The scope of protection of the disclosure should be defined by the appended claims.

What is claimed is:

1. A manufacturing method of a light-emitting diode package structure, comprising:

first, providing a driving substrate and at least one mini light-emitting diode;

second, joining the at least one mini light-emitting diode on the driving substrate, wherein the driving substrate has a surface, and the at least one mini light-emitting diode is disposed on the surface of the driving substrate and is electrically connected to the driving substrate;

third, forming a wavelength conversion layer to cover the at least one mini light-emitting diode;

fourth, performing a singulation process to cut the wavelength conversion layer and the driving substrate to define a light-emitting unit positioned on the driving substrate; and fifth, forming a reflective colloid to cover a periphery of the light-emitting unit and the driving substrate, wherein the light-emitting unit is suitable for emitting a light, and the reflective colloid is suitable for reflecting the light so as to focus on a light-emitting direction.

2. The manufacturing method of the light-emitting diode package structure as described in claim 1, wherein the at least one mini light-emitting diode comprises a plurality of mini light-emitting diodes; the plurality of mini light-emitting diodes are separated from each other and disposed on the driving substrate; and the wavelength conversion layer covers the plurality of mini light-emitting diodes and the driving substrate.

3. The manufacturing method of the light-emitting diode package structure as described in claim 1, wherein a method of forming the reflective colloid comprises integrally forming by a mold filling manner.

* * * * *